United States Patent
Morimitsu

(10) Patent No.: US 11,237,196 B2
(45) Date of Patent: Feb. 1, 2022

(54) RESISTANCE MEASUREMENT DEVICE, FILM MANUFACTURING APPARATUS, AND MANUFACTURING METHOD OF ELECTRICALLY CONDUCTIVE FILM

(71) Applicant: NITTO DENKO CORPORATION, Ibaraki (JP)

(72) Inventor: Daiki Morimitsu, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/041,106

(22) PCT Filed: Dec. 17, 2018

(86) PCT No.: PCT/JP2018/046377
§ 371 (c)(1),
(2) Date: Sep. 24, 2020

(87) PCT Pub. No.: WO2019/187395
PCT Pub. Date: Oct. 3, 2019

(65) Prior Publication Data
US 2021/0102982 A1 Apr. 8, 2021

(30) Foreign Application Priority Data
Mar. 27, 2018 (JP) .............................. JP2018-059786

(51) Int. Cl.
*G01R 27/02* (2006.01)
*C23C 14/34* (2006.01)
(Continued)

(52) U.S. Cl.
CPC .............. *G01R 27/02* (2013.01); *C23C 14/34* (2013.01); *C23C 14/54* (2013.01); *G01N 27/90* (2013.01)

(58) Field of Classification Search
CPC ........ G01R 27/00; G01R 27/02; G01R 27/08; G01R 35/00; C23C 14/00; C23C 14/22;
(Continued)

(56) References Cited

U.S. PATENT DOCUMENTS 5,914,611 A * 6/1999 Cheng ...................... G01B 7/06
324/719
6,657,439 B1 12/2003 Harada
(Continued)

FOREIGN PATENT DOCUMENTS

JP S60-249067 A 12/1985
JP 2000-74634 A 3/2000
(Continued)

OTHER PUBLICATIONS

Notification Concerning Transmittal of International Preliminary Report on Patentability (Form PCT/IB/326) issued in counterpart International Application No. PCT/JP2018/046377 dated Oct. 8, 2020 with Forms PCT/IB/373, PCT/IB/338 and PCT/ISA/237. (12 pages).
(Continued)

*Primary Examiner* — Hoai-An D. Nguyen
(74) *Attorney, Agent, or Firm* — Westerman, Hattori, Daniels & Adrian, LLP

(57) ABSTRACT

A resistance measurement device for measuring sheet resistance of an electrically conductive film that is long in one direction includes a probe unit disposed to face the electrically conductive film; a scanning unit that allows the probe unit to scan in a cross direction crossing the one direction over both a conveyance region and a non-conveyance region of the electrically conductive film; and an arithmetic unit that calculates a sheet resistance of the electrically conductive film based on a voltage measured by the probe unit. The arithmetic unit has a memory that memorizes a reference
(Continued)

voltage measured in the non-conveyance region, and corrects, based on the reference voltage, an actual voltage measured by allowing the probe unit to scan in the cross direction in the conveyance region.

5 Claims, 6 Drawing Sheets

(51) Int. Cl.
*C23C 14/54* (2006.01)
*G01N 27/90* (2021.01)

(58) Field of Classification Search
CPC ......... C23C 14/34; C23C 14/52; C23C 14/54; C23C 14/56; C23C 14/562; G01N 27/00; G01N 27/72; G01N 27/82; G01N 27/90; G01N 27/9013; G01N 27/902
USPC ............... 324/600, 649, 691, 500, 512, 525
See application file for complete search history.

(56) References Cited

U.S. PATENT DOCUMENTS

| | | | | |
|---|---|---|---|---|
| 6,815,959 B2* | 11/2004 | Johnson | ............. | G01R 1/06711 324/718 |
| 7,404,313 B2* | 7/2008 | Watanabe | ............. | G01Q 20/04 73/105 |
| 7,436,190 B2* | 10/2008 | Oya | ............. | B32B 27/08 324/754.21 |
| 10,215,779 B2* | 2/2019 | Imai | ............. | G01R 15/16 |
| 2005/0073323 A1* | 4/2005 | Kohno | ............. | G01R 27/2605 324/662 |
| 2014/0106134 A1* | 4/2014 | Fu | ............. | C09D 11/52 428/195.1 |
| 2015/0327782 A1* | 11/2015 | Tateishi | ............. | A61B 5/026 600/479 |
| 2020/0333911 A1* | 10/2020 | Kurasawa | ............. | G06F 3/0446 |

FOREIGN PATENT DOCUMENTS

| | | |
|---|---|---|
| JP | 2000-214754 A | 8/2000 |
| JP | 2000-314754 A | 11/2000 |
| JP | 2003-197034 A | 7/2003 |
| JP | 2012-73132 A | 4/2012 |

OTHER PUBLICATIONS

International Search Report dated Feb. 19, 2019, issued in counterpart International Application No. PCT/JP2018/046377 (1 page).
Decision to Grant a Patent dated Nov. 16, 2021, issued in counterpart JP Application No. 2018-059786, with English language machine translation.

* cited by examiner

RESISTANCE MEASUREMENT DEVICE, FILM MANUFACTURING APPARATUS, AND MANUFACTURING METHOD OF ELECTRICALLY CONDUCTIVE FILM

TECHNICAL FIELD

The present invention relates to a resistance measurement device, a film manufacturing apparatus, and a method for manufacturing an electrically conductive film.

BACKGROUND ART

An electrically conductive film has been conventionally manufactured by laminating an electrically conductive layer on a substrate film in a roll-to-roll method. The manufactured electrically conductive film is required to have surface resistance (sheet resistance) within a desired range, so that a quality defect of the surface resistance needs to be discovered by measuring the surface resistance. A method has been known in which the surface resistance of the electrically conductive film is measured by using a non-contact resistance measurement device before winding the electrically conductive film (ref for example, the following Patent Document 1).

The non-contact surface resistance measurement device of the following Patent Document 1 includes an eddy current sensor consisting of an eddy current generating portion and an eddy current detection portion, and a temperature sensor for detecting a temperature of the eddy current sensor.

In the device of the following Patent Document 1, a surface resistance value of the electrically conductive film is calculated based on a detection result of the eddy current sensor and the temperature sensor. Thus, a measurement error can be reduced, where the measurement error is caused by thermal conductivity change of a coil in the eddy current sensor due to an increase in a coil temperature.

CITATION LIST

Patent Document

Patent Document 1: Japanese Unexamined Patent Publication No. 2003-197034.

SUMMARY OF THE INVENTION

Problem to be Solved by the Invention

In the device of the above-described Patent Document 1, however, there is a disadvantage that the measurement error on the measured electrically conductive film increases when measurement is carried out for a long time.

Considering the measurement error, the inventors of the present invention recognize that hysteresis is generated in a relationship between a temperature detected with the temperature sensor and a voltage. That is, it is recognized that the measurement for a long time causes a difference in the detected voltage even at the same temperature between during heating and during cooling of the coil according to device characteristics of the temperature sensor and the coil. In correction with the temperature sensor in the device of Patent Document 1, the error due to the device characteristic such as the hysteresis is not taken into consideration.

The present invention provides a resistance measurement device having excellent measurement accuracy even when measuring sheet resistance of an electrically conductive film for a long time, a film manufacturing apparatus including the resistance measurement device, and a method for manufacturing an electrically conductive film.

Means for Solving the Problem

The present invention [1] includes a resistance measurement device for measuring sheet resistance of an electrically conductive film that is long in one direction, including a probe unit disposed to face the electrically conductive film; a scanning, unit that allows the probe unit to scan in a cross direction crossing the one direction over; and an arithmetic unit that calculates a sheet resistance of the electrically conductive film based on a voltage measured by the probe unit, wherein the arithmetic unit includes a memory that memorizes a reference voltage measured in the non-conveyance region, and corrects, based on the reference voltage, an actual voltage measured by allowing the probe unit to scan in the cross direction in the conveyance region.

In the resistance measurement device, the probe unit scans in both the conveyance region and the non-conveyance region of the electrically conductive film, and the actual voltage measured in the conveyance region is corrected based on the reference voltage measured in the non-conveyance region.

Thus, the reference voltage of the non-conveyance region in the process of measurement is measured, and the actual voltage can be corrected based on the reference voltage. Accordingly, the resistance measurement device can correct the actual voltage based on the reference voltage, which takes into consideration of device characteristics such as hysteresis generated in the probe unit during long time measurement, and calculate a sheet resistance. As a result, measurement accuracy (preciseness of measurement) of the sheet resistance of the electrically conductive film can be improved.

The present invention [2] includes the resistance measurement device described in [1], wherein the arithmetic unit memorizes the reference voltage in the memory at least once every one reciprocation or multiple reciprocations of the probe unit in the non-conveyance region and the conveyance region.

In the resistance measurement device, the reference voltage is memorized in the memory at least once every one reciprocation or multiple reciprocations of the probe unit. Thus, the actual voltage immediately after the reference voltage can be corrected based on the reference voltage measured every reciprocation of the probe unit, and the measurement accuracy of the sheet resistance of the electrically conductive film can be furthermore improved.

The present invention [3] includes a film manufacturing apparatus for manufacturing an electrically conductive film that is long in one direction, including a lamination unit that laminates an electrically conductive layer at a substrate film that is long in the one direction to produce an electrically conductive film; a conveyance unit that conveys the electrically conductive film; and the resistance measurement, device described in [1] or [2], that measures sheet resistance of the electrically conductive film conveyed by the conveyance unit.

The film manufacturing apparatus is provided with the above-described resistance measurement device, so that a defect of the sheet resistance can be precisely detected. Accordingly, the electrically conductive film having the defective sheet resistance can be surely considered. Thus, the electrically conductive film having the furthermore uniform sheet resistance can be manufactured.

The present invention [4] includes a method for manufacturing an electrically conductive film that is long in one direction, including a lamination step of laminating an electrically conductive layer at a substrate film that is long in the one direction to produce an electrically conductive film; and a resistance measurement step of measuring sheet resistance of the electrically conductive film, while conveying the electrically conductive film in the one direction, and allowing a probe unit to scan in a cross direction crossing the one direction over both a conveyance region and a non-conveyance region of the electrically conductive film, wherein the resistance measurement step includes a reference voltage measurement step of measuring a reference voltage in the non-conveyance region; an actual voltage measurement step of measuring an actual voltage of the electrically conductive film while allowing the probe unit to scan in the cross direction in the conveyance region; and a calculation step of correcting the actual voltage based on the reference voltage, and calculating the sheet resistance of the electrically conductive film.

Thus, the method for manufacturing an electrically conductive film the probe unit scans in both the conveyance region and the non-conveyance region of the electrically conductive film, and the actual voltage measured in the conveyance region is corrected based on the reference voltage measured in the non-conveyance region.

Thus, the reference voltage of the non-conveyance region in the process of measurement is measured, and the actual voltage can be corrected based on the reference voltage. Accordingly, the resistance measurement device can correct the actual voltage based on the reference voltage, which takes into consideration of device characteristics such as hysteresis generated in the probe unit during long time measurement, and calculate a sheet resistance, so that the measurement accuracy (preciseness of measurement) of the sheet resistance of the electrically conductive film is improved. Accordingly, a defect of the sheet resistance of the electrically conductive film can be precisely detected, and the electrically conductive film having the defective sheet resistance can be surely considered. As a result, the electrically conductive film having the uniform sheet resistance can be manufactured.

The present invention [5] includes the method for manufacturing an electrically conductive film described in [4], wherein the reference voltage measurement step is carried out at least once every one reciprocation or multiple reciprocations of the probe unit in the non-conveyance region and the conveyance region.

In the method for manufacturing an electrically conductive film, the reference voltage is memorized in the memory at least once every one reciprocation of the probe unit. Thus, the actual voltage immediately after the reference voltage can be corrected based on the reference voltage measured every reciprocation of the probe unit, and the measurement accuracy of the sheet resistance of the electrically conductive film can be furthermore improved. Accordingly, the measurement accuracy of the electrically conductive film is furthermore improved and a quality defect of the electrically conductive film can be furthermore surely detected. As a result, the furthermore uniform electrically conductive film can be manufactured.

Effect of the Invention

According to the resistance measurement device of the present invention, measurement accuracy of sheet resistance of an electrically conductive film can be improved.

According to the film manufacturing apparatus and the method for manufacturing electrically conductive film of the present invention, an electrically conductive film having uniform sheet resistance can be manufactured.

BRIEF DESCRIPTION OF THE DRAWLNGS

Figure 5A:
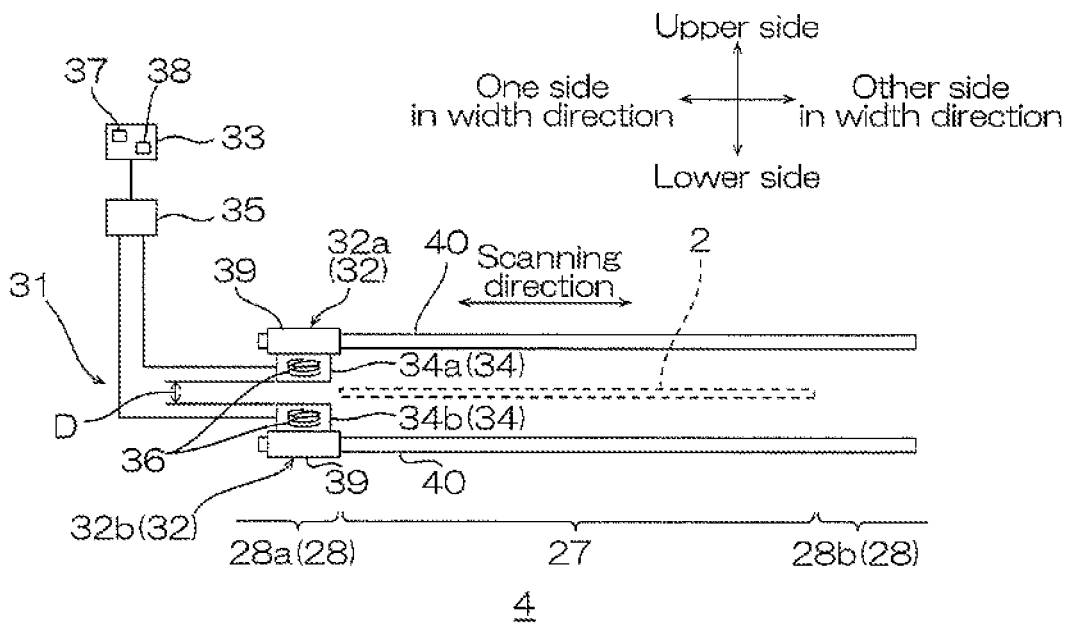
FIGS. 5A and 5B show a modified example (embodiment including scanning in a non-conveyance region at the other side in a width direction) of the resistance measurement device shown in FIGS. 3 and 4.

FIG. 5A illustrating a front view and

Figure 5B:
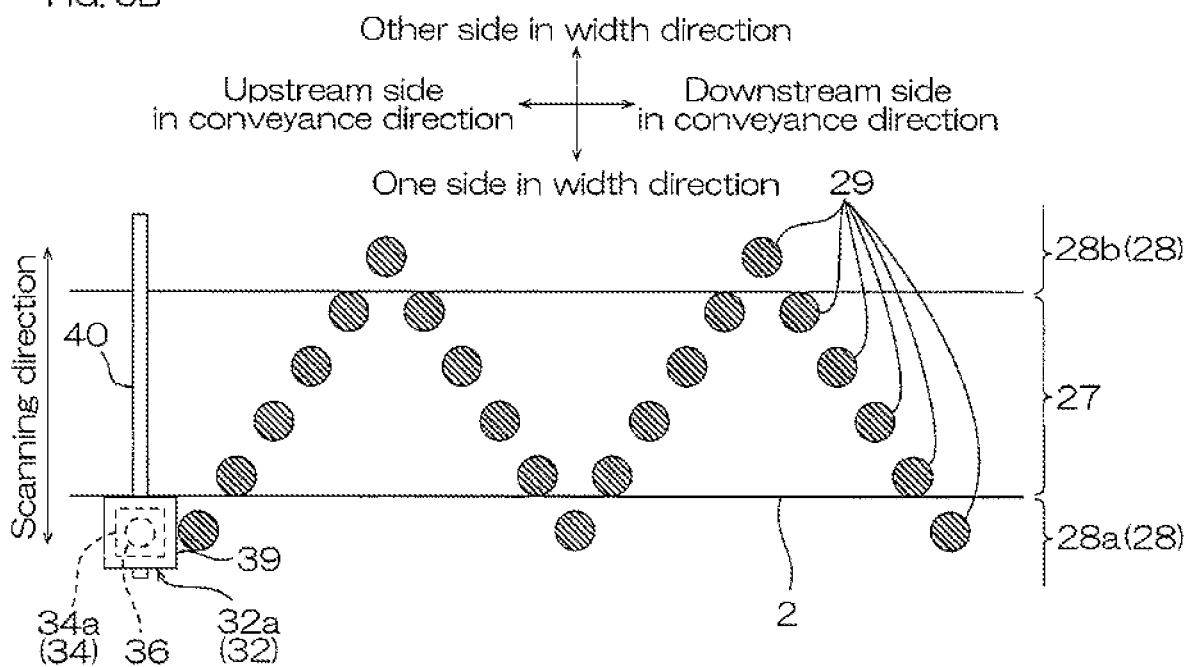

FIG. 5B illustrating a plan view.

Figure 6:
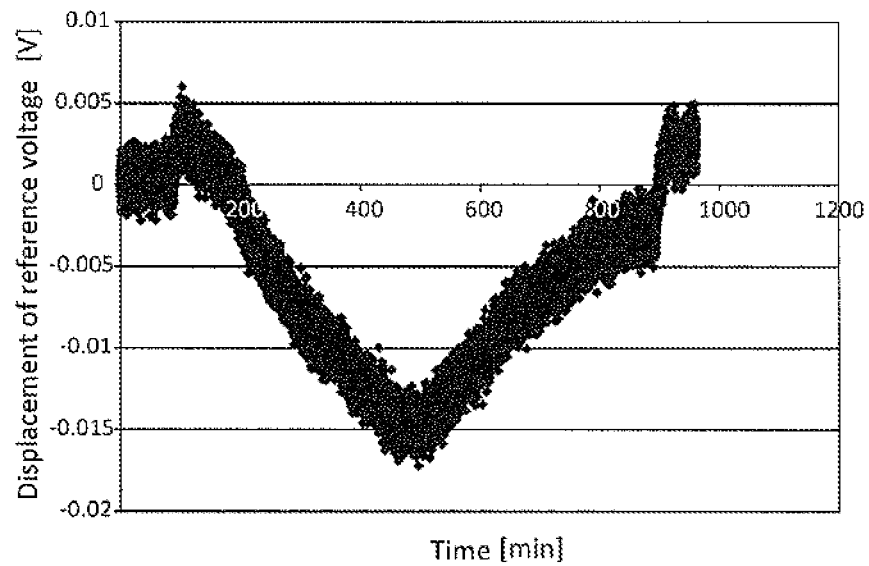

FIG. 6 shows a graph showing a relationship between measurement time and displacement of a reference voltage in a measurement device of reference example.

Figure 7:
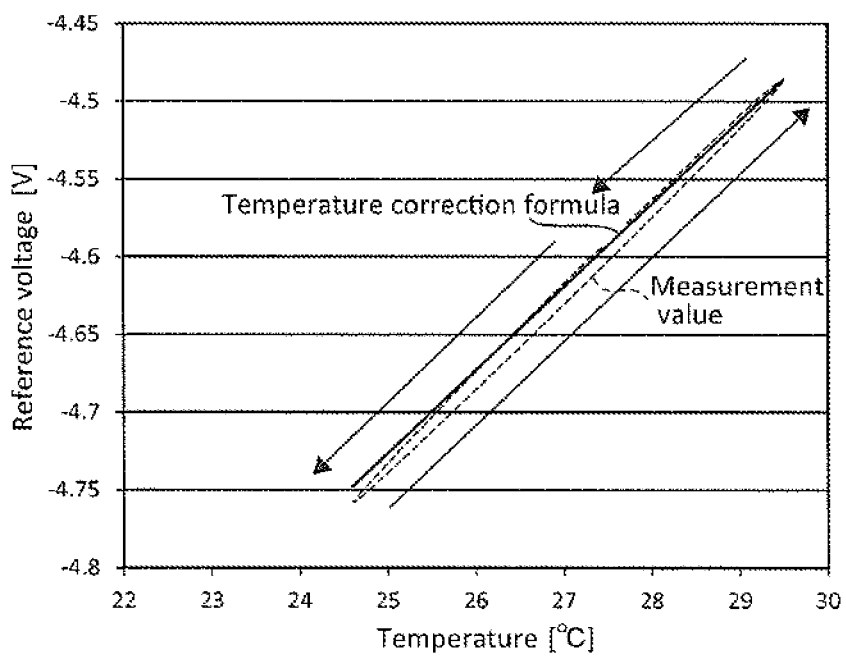

FIG. 7 shows a graph showing a relationship of hysteresis in a measurement device of reference example.

Figure 8:
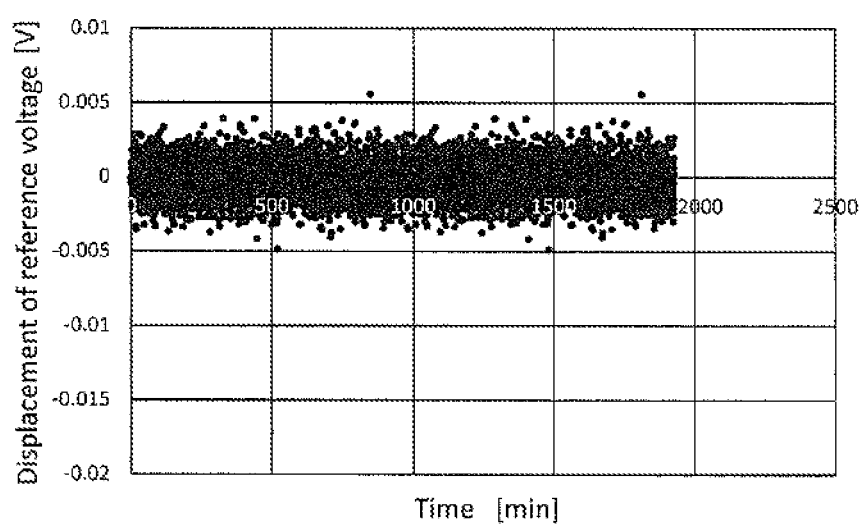

FIG. 8 shows a graph showing a relationship between measurement time and displacement of a reference voltage in a measurement device of the present invention.

Figure 9:
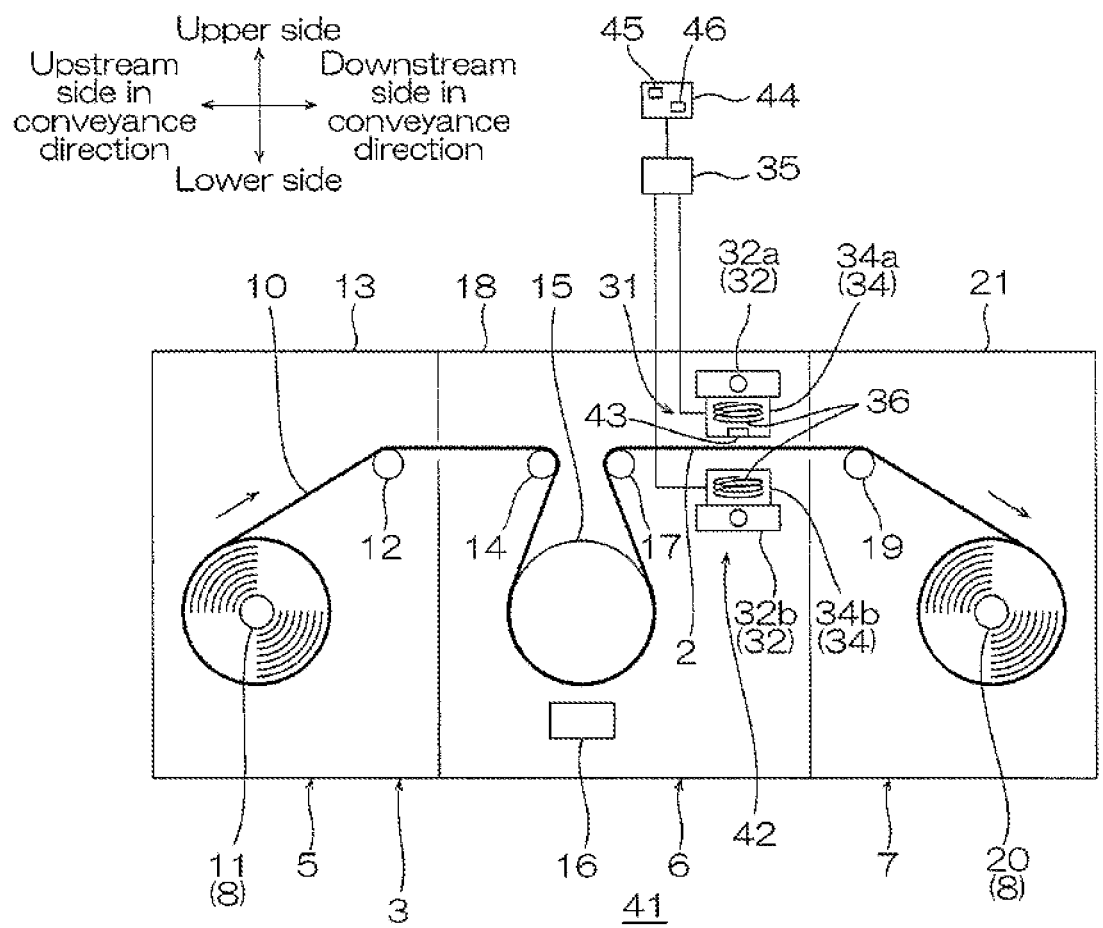

FIG. 9 shows a film manufacturing apparatus of reference embodiment.

DESCRIPTION OF EMBODIMENTS

Figure 1:
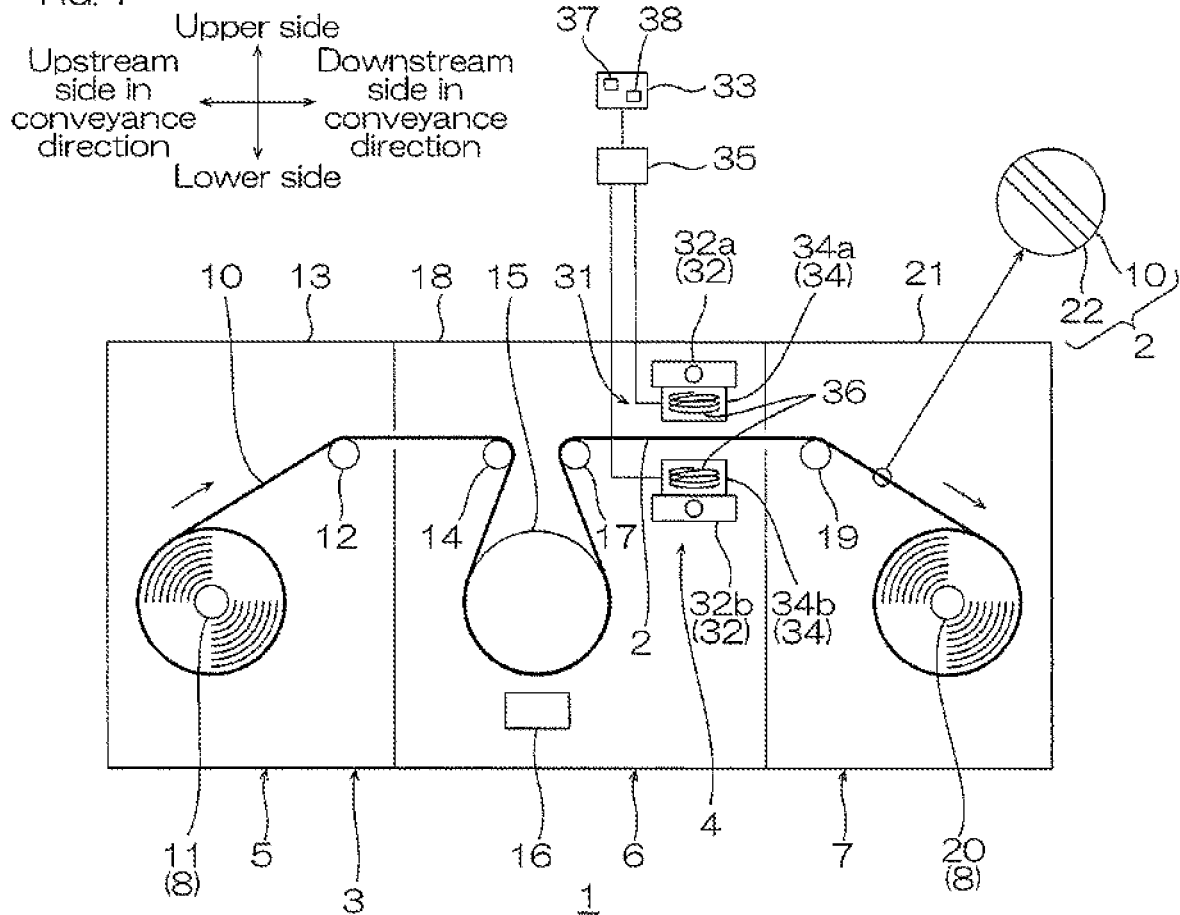
FIG. 1 shows one embodiment of a film manufacturing apparatus of the present invention.

In FIG. 1, the right-left direction on the plane of the sheet is a conveyance direction (first direction, longitudinal direction, one direction), the right side on the plane of the sheet is a downstream side in the conveyance direction (one side in the first direction, one side in the longitudinal direction), and the left side on the plane of the sheet is an upstream side in the conveyance direction (the other side in the first direction, the other side in the longitudinal direction). The paper thickness direction is a width direction (second direction perpendicular to the first direction), the near side on the plane of the sheet is one side in the width direction (one side in the second direction), and the depth side on the plane of the sheet is the other side in the width direction (the other side in the second direction). The up-down direction on the plane of the sheet is an up-down direction (third direction perpendicular to the first direction and the second direction, thickness direction), the upper side on the plane of the sheet is an upper side (one side in the third direction, one side in the thickness direction), and the lower side on the plane of the sheet is a lower side (the other side in the third direction, the other side in the thickness direction). Directions in views other than FIG. 1 are also in conformity with those of FIG. 1.

One Embodiment

1. Film Manufacturing Apparatus

A film manufacturing apparatus 1 of one embodiment of the present invention is described with reference to FIGS. 1 to 3. The firm manufacturing apparatus 1 shown in FIG. 1 is an apparatus for manufacturing an electrically conductive film 2 that is long in length in the conveyance direction (one direction), and includes a lamination conveyance device 3 and a resistance measurement device 4.

[Lamination Conveyance Device]

As shown in FIG. 1, the lamination conveyance device 3 includes a feeding unit 5, a sputtering unit 6 as one example of a lamination unit, and a winding unit 7.

The feeding unit 5 includes a feeding roll 11, a first guiding roll 12, and a feeding chamber 13.

The feeding roll 11 is a columnar member, having a rotation axis, for feeding a substrate film 10. The feeding roll 11 is disposed at the most upstream-side in the conveyance direction of the lamination conveyance device 3. A motor (not shown) for rotating the feeding roll 11 is connected to the feeding roll 11.

The first guiding roll 12 is a rotation member that guides the substrate film 10 fed out from the feeding roll 11 to the sputtering unit 6. The first guiding roll 12 is disposed at the downstream side in the conveyance direction of the feeding roll 11 and the upstream side in the conveyance direction of a second guiding roll 14 (described later).

The feeding chamber 13 is casing for housing the feeding roll 11 and the first guiding roll 12. The feeding chamber 13 is provided with a vacuum unit enabling vacuumization of the inside of the feeding chamber 13.

In the sputtering unit 6, an electrically conductive layer 22 (described later) is laminated on the substrate film 10, conveyed from the feeding unit 5, by a sputtering method. The sputtering unit 6 is disposed at the downstream side in the conveyance direction of the feeding unit 5 and the upstream side in the conveyance direction of the winding unit 7 so as to be adjacent to the feeding unit 5 and the winding unit 7. The sputtering unit 6 includes a second guiding roll 14, a film-forming roll 15, a target 16, a third guiding roll 17, and a film-forming chamber 18.

The second guiding roll 14 is a rotation member that guides the substrate film 10 conveyed from the feeding unit 5 to the film-forming roll 15. The second guiding roll 14 is disposed at the downstream side in the conveyance direction of the first guiding roll 12 and the upstream side in the conveyance direction of the film-forming roll 15.

The film-forming roll 15 is a columnar member, having a rotation axis, for laminating the electrically conductive layer 22 on the substrate film 10. The film-forming roll 15 conveys the substrate film 10 along a circumferential surface of the film-forming roll 15 in a circumferential direction thereof. The film-forming roll 15 is disposed at the downstream side in the conveyance direction of the second guiding roll 14 and the upstream side in the conveyance direction of the third guiding roll 17.

The target 16 is formed from a material for the electrically conductive layer 22. The target 16 is disposed around the film-forming roll 15. To be specific, the target 16 is disposed to face the film-forming roll 15 at the lower side thereof in spaced apart relation to the film-forming roll 15.

The third guiding roll 17 is a rotation member that guides the electrically conductive film 2 conveyed from the film-forming roll 15 to the winding unit 7 via the resistance measurement device 4. The third guiding roll 17 is disposed at the downstream side in the conveyance direction of the second guiding roll 14 and the upstream side in the conveyance direction of a fourth guiding roll 19 (described later).

The film-forming chamber 18 is a casing for housing the second guiding roll 14, the film-forming roll 15, the target 16, the third guiding roll 17, and a resistance measurement device 4 (described later). The film-forming chamber 18 is provided with a vacuum unit enabling vacuumization of the inside of the film-forming chamber 18.

The winding unit 7 includes a fourth guiding roll 19, a winding roll 20, and a winding chamber 21. The winding unit 7 is disposed at the downstream side in the conveyance direction of the sputtering unit 6 so as to be adjacent thereto.

The fourth guiding roll 19 is a rotation member that guides the electrically conductive film 2 conveyed from the sputtering unit 6 to the winding roll 20. The fourth guiding roll 19 is disposed at the downstream side in the conveyance direction of the third guiding roll 17 and the upstream side in the conveyance direction of the winding roll 20.

The winding roll 20 is a columnar member, having a rotation axis, fir winding the electrically conductive film 2. The winding roll 20 is disposed at the most downstream-side the conveyance direction of the substrate film 10. A motor (not shown) for rotating the winding roll 20 is connected to the winding roll 20.

The winding chamber 21 is a casing for housing the winding roll 20 and the fourth guiding roll 19. The winding chamber 21 is provided with a vacuum unit for enabling vacuumization of the inside of the winding chamber 21.

The feeding roll 11 and the winding roll 20 constitute one example of a conveyance unit 8.

[Resistance Measurement Device]

As shown in FIG. 1, the resistance measurement device 4 is disposed at the inside of the sputtering unit 6. To be specific, the resistance measurement device 4 is disposed at the downstream side in the conveyance direction of the film-forming roll 15 and the third guiding roll 17 and the upstream side in the conveyance direction of the fourth guiding roll 19 and the winding roll 20.

Figure 2:
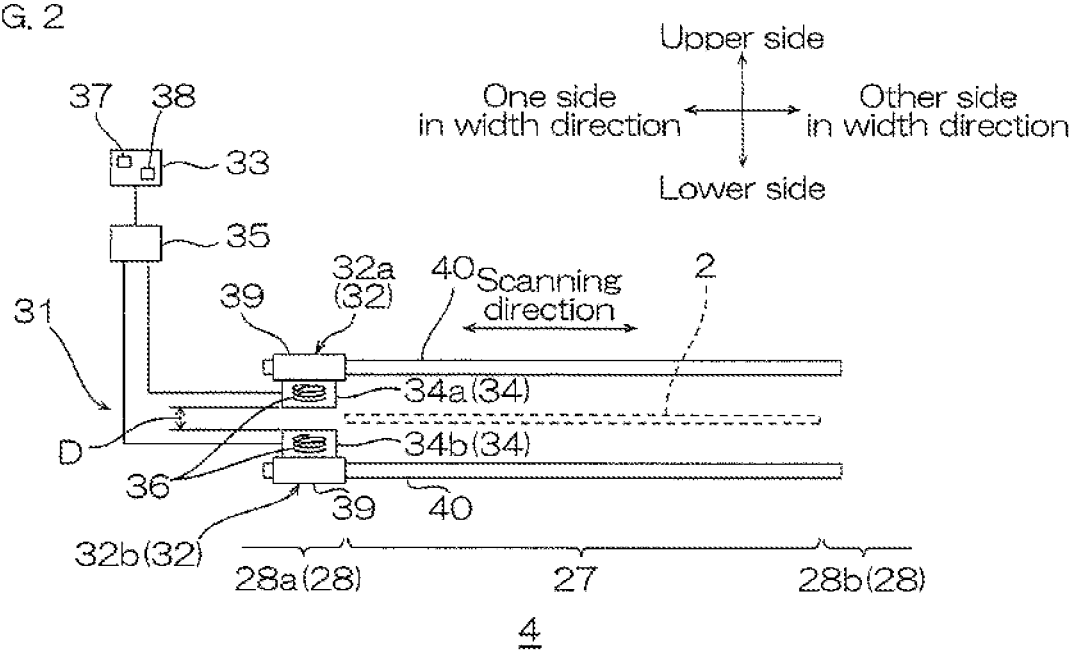
FIG. 2 shows a front view of a resistance measurement device provided in the film manufacturing apparatus shown in FIG. 1.
Figure 3:
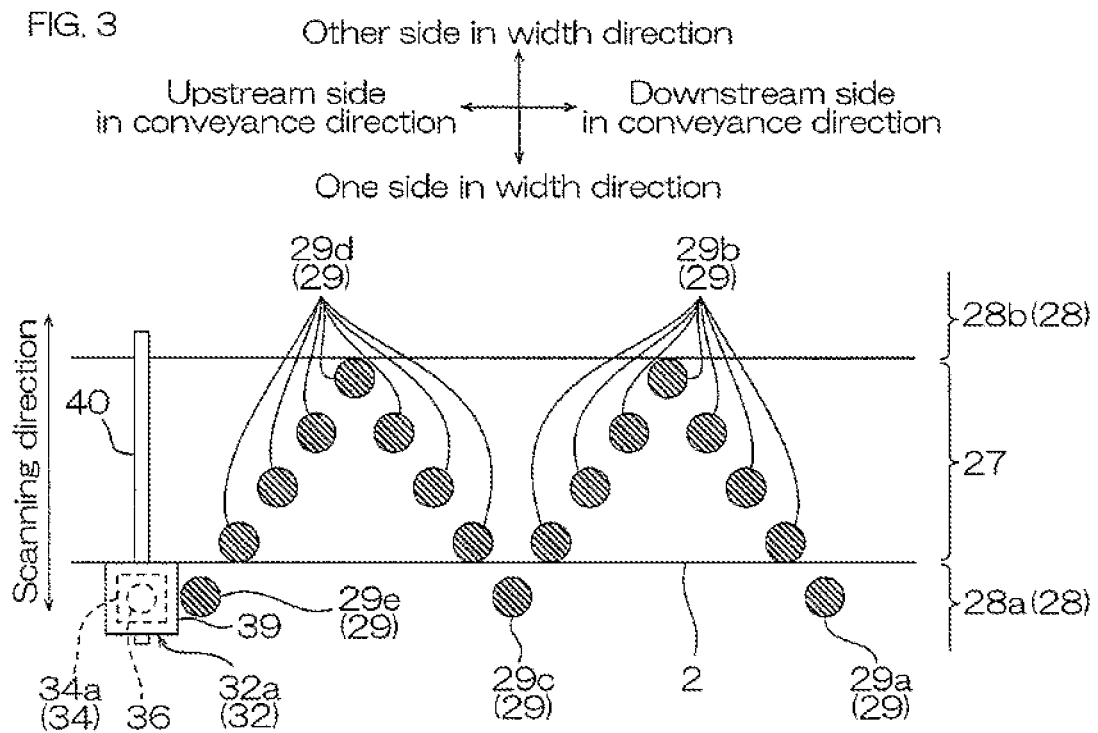
FIG. 3 shows a plan view of FIG. 2.

As shown in FIGS. 2 and 3, the resistance measurement device 4 includes a non-contact resistance measurement unit 31 (hereinafter, also abbreviated as a measurement unit 31), a scanning unit 32, and an arithmetic unit 33.

The measurement unit 31 is a unit that measures sheet resistance of the electrically conductive film 2 in a state of not being in contact with the electrically conductive film 2 (object to be measured). To be specific, the measurement unit 31 is an eddy current-type measurement unit. In the measurement unit 31, an eddy current is generated in the electrically conductive film 2 by applying a magnetic field thereto, and the sheet resist-mice of the electrically conductive film 2 is measured by using a change in an electric current flowing in a coil 36 due to the influence of the eddy current.

The measurement unit 31 includes a probe unit 34 and a measurement circuit unit 35.

The probe unit 34 is a unit that receives information (magnetic field or the like) from the electrically conductive film 2. To be specific, the probe unit 34 applies the magnetic field to the electrically conductive film 2, and converts a diamagnetic field due to the eddy current of the electrically conductive film 2 into the electric current.

The probe unit 34 is a double-sided probing unit, and includes two probes 34a and 34b that are disposed in spaced apart relation to face each other. That is, the probe unit 34 includes the upper-side probe 34a disposed at the upper side of the electrically conductive film 2 in spaced apart relation to the film and the lower-side probe 34b disposed at the lower side of the electrically conductive film 2 in spaced apart relation to the film. A distance in the up-down direction between the two probes 34a and 34b is variable. That is, at least one of an upper-side scanning unit 32a and a lower-side scanning unit 32b to be described later is movable and fixable in the up-down direction.

Each of the upper-side probe 34a and the lower-side probe 34b includes the coil 36. The coil 36 disposed in the upper-side probe 34a and that the coil 36 disposed in the lower-side probe 34b are provided so as to have substantially the same shape when projected in the up-down direction.

Each of the coils 36 has a diameter of, for example, 100 mm or less, preferably 80 mm or less, and more preferably 40 mm or less; and for example, 10 mm or more. When the diameter of the coil 36 is the above-described upper limit or less, the minimum area of a measurement spot 29 (described later) at which the probe unit 34 can detect the sheet resistance can be reduced, and sensitivity (resolution) in the width direction thereof can be improved.

A distance D in the up-down direction (probe gap) between the probe units 34 is, for example, 5 mm or more, and preferably 10 mm or more; and for example, 30 mm or less, preferably 15 mm or less.

The measurement circuit unit 35 is a unit including an electric circuit that is electrically connected to the two coils 36. The measurement circuit unit 35 includes, for example, an element required for driving the measurement unit 31 such as high-frequency oscillator, condenser, voltmeter, ammeter, and I-V conversion circuit.

The scanning unit 32 is a unit for moving the probe unit 34 in both a non-conveyance region 28 (described later and a conveyance region 27 (described later) in the width direction (direction perpendicular to the conveyance direction: one example of a cross direction). To be specific, the scanning unit 32 reciprocates the probe unit 34 between the other end portion in the width direction of a one-side non-conveyance region 28a and the other end portion in the width direction of the conveyance region 27. The scanning unit 32 reciprocates the probe unit 34, while relative arrangement (facing arrangement) of the probe units 34 (the upper-side probe 34a and the lower-side probe 34b to be described later) is retained.

The scanning unit 32 includes the upper-side scanning unit 32a and the lower-side scanning unit 32b.

The upper-side scanning unit 32a includes a slider 39 that retains the upper-side probe 34a on the lower surface (the other-side surface in the thickness direction) thereof, and a linear guiding axis (traverse axis) 40 crossing both end edges of the conveyance region 27 in the width direction. In the upper-side scanning unit 32a, the slider 39 outer-fits the guiding axis 40 slidably, and the slider 39 linearly moves so as to traverse the conveyance region 27 in the width direction along the guiding axis 40 by a driving force of a motor that is not shown.

The lower-side scanning unit 32b includes the slider 39 that retains the lower-side probe 34h on the upper surface (one-side surface in the thickness direction) thereof, and the linear guiding axis (traverse axis) 40 crossing both end edges of the conveyance region 27 in the width direction. These are the same as the slider 39 and the guiding axis 40 of the upper-side scanning unit 32a.

The arithmetic unit 33 includes a memory 37 and a CPU 38.

The memory 37 memorizes data of a reference voltage measured by the measurement unit 31. To be specific the memory 37 memorizes the data of the reference voltage measured in the non-conveyance region 28.

The memory 37 also memorizes the data of the actual voltage of the electrically conductive film 2 measured by the measurement unit 31, and an arithmetic program that calculates a sheet resistance of the electrically conductive film 2 based on the data of the actual voltage and the data of the reference voltage.

The CPU 38 runs the above-described arithmetic program to correct the actual voltage based on the reference voltage and to calculate a sheet resistance by a known calculation formula using the corrected actual voltage (correction voltage).

2. Method for Manufacturing Film

One embodiment of a method for manufacturing, the electrically conductive film 2 by using the film manufacturing apparatus 1 is described. The method for manufacturing the electrically conductive film 2 includes a lamination step, a resistance measurement step, and a selection step.

[Lamination Step]

In the lamination step, the electrically conductive layer 22 is laminated on the substrate film 10, while the substrate film 10 is conveyed. To be specific, the electrically conductive layer 22 is formed on the surface of the substrate film 10 by the sputtering method, while the substrate film 10 is conveyed (ref enlarged view of FIG. 1).

First, the substrate film 10 that is long in length in the conveyance direction is disposed in the feeding roll 11. That is, a rolled body obtained by winding the long-length substrate film 10 in a rolled shape is mounted on the feeding roll 11.

An example of the substrate film 10 includes a polymer film. Examples of a material for the polymer film include polyester resins such as polyethylene terephthalate, polybutylene terephthalate, and polyethylene naphthalate; (meth)acrylic resins such as polymethacrylate, olefin resins such as polyethylene, polypropylene, and cycloolefin polymer; polycarbonate resin; polyether sulfone resin; polyarylate resin; melamine resin; polyamide resin; polyimide resin; cellulose resin; and polystyrene resin.

A length in the width direction of the substrate film 10 (that is, length in the width direction of the conveyance region 27) is, for example, 100 mm or more, and preferably 200 mm or more; and for example, 5000 mm or less, and preferably 2000 mm or less.

Next, the feeding roll 11 and the winding roll 20 are rotationally driven by a motor to feed the substrate film 10 out from the feeding roll 11. Then, the substrate film 10 is sequentially conveyed to the first guiding roll 12, the second guiding roll 14, the film-forming roll 15, the third guiding roll 17, and the fourth guiding roll 19 to be wound around the winding roll 20.

A conveyance rate of the substrate film 10 (conveyance rate of the electrically conductive film 2) is, for example, 10 mm/sec or more, and preferably 100 mm/sec or more; and for example, 500 mm/sec or less, preferably 300 mm/sec or less.

In this manner, the substrate film 10 is conveyed from the feeding roll 11 to the winding roll 20 in the conveyance direction in a roll-to-roll method (conveyance step).

Next, sputtering is carried out. That is, the sputtering unit 6 is activated, and the electrically conductive layer 22 is formed on the substrate film 10.

To be specific, gas (argon or the like) is supplied to the inside of the film-forming chamber 18 under vacuum, and a voltage is applied thereto, so that the gas collides with the target 16. As a result, a target material sprung out from the target 16 is, below the film-forming roll 15, attached to the lower surface of the substrate film 10 that is conveyed from the upstream side in the conveyance direction, thereby forming the electrically conductive layer 22.

Examples of a material for the target 16, that is, a material for the electrically conductive layer 22 include metal oxides such as indium tin composite oxide and antimony tin composite oxide metal nitrides such as aluminum nitride, titanium nitride, tantalum nitride, chromium nitride, gallium nitride, and composite nitride thereof; and metals such as gold, silver, copper, nickel, and alloy thereof.

In this manner, the electrically conductive film 2 including the substrate film 10 and the electrically conductive layer 22 laminated on the lower surface thereof is produced at the lower side of the film-forming roll 15 (electrically conductive layer forming step).

Thereafter, the electrically conductive film 2 produced at the lower side of the film-forming roll 15 is conveyed toward the resistance measurement device 4 at the downstream side in the conveyance direction by the film-forming roll 15 and the third guiding roll 17.

[Resistance Measurement Step]

Figure 4:
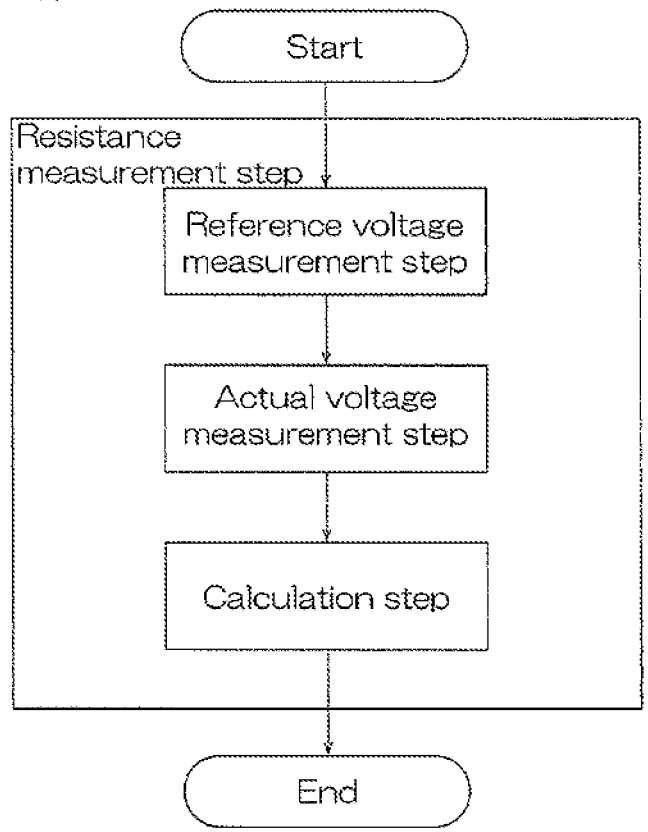
FIG. 4 shows a flow chart of a resistance measurement step in one embodiment of a method for manufacturing an electrically conductive film of the present invention.

In the resistance measurement step, the sheet resistance of the electrically conductive film 2 is measured, while the electrically conductive film 2 is conveyed in the conveyance direction. As shown in a flow chart of FIG. 4, the resistance measurement step includes a voltage measurement step and a calculation step.

(Voltage Measurement Step)

In the voltage measurement step, the voltage is measured, while the probe unit 34 scans in the width direction with respect to the conveyed electrically conductive film 2. The voltage measurement step includes a reference voltage measurement step and an actual voltage measurement step.

The scanning in the width direction of the probe unit 34 continues during the measurement step. As shown in FIGS. 2 and 3, the probe unit 34 reciprocates in both the non-conveyance region 28 and the conveyance region 27.

The conveyance region 27 is a region that is overlapped with the conveyed electrically conductive film 2 when projected in the up-down direction (thickness direction), and a length in the width direction of the conveyance region 27 matches the length in the width direction of the electrically conductive film 2. The non-conveyance region 28 is a region other than the conveyance region 27, and is defined at the outside in the width direction of the conveyance region 27 (one side in the width direction and the other side in the width direction). That is, the non-conveyance region 28 has a one-side non-conveyance region 28a disposed at one side in the width direction of the conveyance region 27 and an other-side non-conveyance region 28b disposed at the other side in the width direction of the conveyance region 27.

The probe unit 34 traverses the conveyance region 27 in the width direction from the one-side non-conveyance region 28a to the other end portion in the width direction of the conveyance region 27, and trims back to traverse again the conveyance region 27 in the width direction to the one-side non-conveyance region 28a. This movement is repeated.

A scanning rate of the probe unit 34 is, for example, 10 mm/sec or more, and preferably 100 mm/sec or more; and for example, 500 mm/sec or less, preferably 300 mm/sec or less.

A voltage is measured first in the non-conveyance region 28 (reference voltage measurement step). That is, when the probe unit 34 scans in the one-side non-conveyance region 28a, the voltage is measured. At this time, a gap between the probe units 34 is a state where the electrically conductive film 2 is not interposed (empty state).

The voltage is measured by activating the measurement unit 31. That is, a magnetic field is generated between the probe units 34, and the voltage of the electric current flowing in the measurement circuit unit 35 is detected.

In this manner, the reference voltage is measured, and the data of the reference voltage is memorized in the memory 37. To be specific, a profile showing a relationship between measurement time (or measurement position) (horizontal axis) and the reference voltage at the time (vertical axis) is obtained. The measurement, position, in the electrically conductive film 2 is calculated based on the measurement time, the conveyance rate of the electrically conductive film 2, and the scanning rate of the scanning unit 32.

Subsequently, the voltage is also measured during the scanning in the conveyance region 27 by the probe unit 34 after the reference voltage measurement step (actual voltage measurement step). To be specific, the measurement is carried out in a plurality of times (for example, seven times in FIG. 3) while the probe unit 34 reaches the other end portion in the width direction from one end portion in the width direction of the conveyance region 27 and returns back from the other end portion in the width direction to one end portion in the width direction (during one reciprocation). At this time, the electrically conductive film 2 is conveyed toward the downstream side in the conveyance direction between the probe units 34, in a state where the electrically conductive film 2 is not in contact with the probe units 34.

In this manner, the actual voltage of the electrically conductive film 2 is measured, and the data of the actual voltage is memorized in the memory 37. To be specific, the profile showing a relationship between the measurement time (or the measurement position) (horizontal axis) and the actual voltage at the time (vertical axis) is obtained.

As shown in FIG. 3, each of the measurement spots 29 measured by the probe unit 34 has a generally circular shape that is larger than the coil 35 when viewed from the top. That is, a diameter of the measurement spot 29 is larger than a diameter of the coil 36.

A pattern consisting of an assembly of the plurality of measurement spots 29 (measurement pattern) has a wave shape proceeding in the conveyance direction when viewed from the top. Of the plurality of measurement spots 29, the measurement spots 29 disposed at the most one-side in the width direction (29a, 29c) are positioned in the non-conveyance region 28, and the measurement spots 29 other than those (29b, 29d) are positioned in the conveyance region 27.

The reference voltage measurement step and the actual voltage measurement step are repeatedly carried out.

A value of the reference voltage and a value of the actual voltage thus obtained include the influence of a coil temperature and the influence of the hysteresis.

(Calculation. Step)

The calculation step corrects the actual voltage based on the reference voltage to calculate a sheet resistance of the electrically conductive film 2.

That is, the actual voltage is corrected based on the reference voltage by, for example, four basic operations of arithmetic, and the sheet resistance is calculated by using a known calculation method. The sheet resistance is, for example, calculated by using the following calculation formula.

$$Pc = Et(Io + Ie)$$

$$\rho s = \frac{Et \cdot K}{Ie + Io}$$

$$Ie = R \cdot Ve$$

$$Io = R \cdot (Vo + V\alpha)$$

In formula, Pc shows a high-frequency power value, Et shows a high-frequency voltage value, Io shows a current value in the case of an absence of an object to be measured (the electrically conductive film 2), Ie shows an eddy current detection current value, ρs shows sheet resistance, K shows a coil coupling coefficient, R shows a resistance value of an conversion circuit, Ve shows an eddy current detection voltage value, Vo shows a voltage value in the case of an absence of the object to be measured (the electrically conductive film 2), and Vα shows a reference voltage value.

The high-frequency voltage value Et changes by generation of the eddy current, and is controlled to be constant based on an error from a supply voltage. Ie and Io are converted to the voltage values actual voltages) Ve and Vo by the conversion circuit (resistance R. Calibration is carried out to obtain Vo as 0 [V] before the measurement of the electrically conductive film 2, and the sheet resistance is calculated only by Ve. Vo is corrected by the reference voltage value Vα, and the sheet resistance is calculated.

The actual voltage may be further corrected by considering the voltage other than the reference voltage (for example, a constant voltage caused by device characteristics of the measurement unit 31, a changed amount of the voltage due to coil temperature change, or the like) as needed.

At this time, an actual voltage value (Vo in the above-described formula) at the measurement time (or the measurement position) is specified based on the data including the actual voltage data, in calculation of the sheet resistance at a certain measurement time (or certain measurement position). Then, the sheet resistance is calculated by selecting, based on the data of the reference voltage, the reference voltage value (Vα in the above-described formula) measured immediately before the specified actual voltage value.

To be specific, the reference voltage measured in one non-conveyance region 28 (the measurement spot 29a in FIG. 3) is used for the calculation of the sheet resistance (substitution into the above-described formula) corresponding to the plurality of actual voltages measured in the conveyance region 27 (the measurement spot 29b) that is located immediately after the upstream side in the conveyance direction of one non-conveyance region 28 (the measurement spot 29a) until the reference voltage is measured in the subsequent non-conveyance region 28 (the measurement spot 29c). Subsequently, the reference voltage measured in the subsequent non-conveyance region 28 (the measurement spot 29c) is used for the calculation of the sheet resistance corresponding to the plurality of actual voltages measured in the conveyance region 27 (the measurement spot 29d) that is located immediately after the upstream side in the conveyance direction of the subsequent non-conveyance region 28 until the reference voltage is measured in the further subsequent non-conveyance region 28 (a measurement spot 29e). Hereinafter, the operation is repeated.

In this manner, the data of the sheet resistance is obtained. To be specific, the profile showing a relationship between the measurement time (or the measurement position) and the sheet resistance at the measurement time is obtained.

[Selection Step]

In the selection step, the electrically conductive film 2 is selected based on the profile of the sheet resistance.

To be specific, when a plot showing a value (defective value) of the street resistance that, is outside of a predetermined range is detected based on the profile, the measurement showing the defective value is specified. Next, desired treatment (removal of the electric conductive film 2; processing of the electrically conductive layer 22; feedback control of a film-forming process parameter such as gas and electric power; or the like) is carried out for the electrically conductive film 2 at the position.

In this manner, the uniform electrically conductive film 2 having the sheet resistance within a desired range is manufactured.

3. Function and Effect

The resistance measurement device 4 includes the probe unit 34 disposed to face the electrically conductive film 2, the scanning unit 32 that allows the probe unit 34 to scan in the width direction over both the conveyance region 27 and the non-conveyance region 28, and the arithmetic unit 33 that calculates the sheet resistance of the electrically conductive film 2 based on the voltage measured by the probe unit 34. The arithmetic: unit 33 has the memory 37 that memorizes the data of the reference voltage measured in the non-conveyance region 28, and corrects, based on the reference voltage, the actual voltage measured by allowing the probe unit 34 to scan in the width direction in the conveyance region 27.

In the resistance measurement device 4, the probe unit 34 scans in both the conveyance region 27 and the non-conveyance region 28, and the actual voltage measured in the conveyance region 27 is corrected based on the reference voltage measured in the non-conveyance region 28.

Thus, the reference voltage of the non-conveyance region 28 in the process of measurement is measured, and the actual voltage can be corrected based on the reference voltage. To be specific, the reference voltage is deducted from the actual voltage to obtain a correction voltage, and a sheet resistance value is calculated from the correction voltage.

At this time, when the measurement is carried out for a long time, the actual voltage of the electrically conductive film 2 is influenced by the coil temperature and the hysteresis in the probe unit 34, and the reference voltage is also influenced by them in the same manner. In the resistance measurement device 4, the influenced actual voltage is collected based on the reference voltage influenced in the same manner, so that the correction voltage cancels the influence. Accordingly, the influence of the hysteresis as well as the influence of the coil temperature is removed or reduced in the correction voltage. Then, the sheet resistance of the electrically conductive film 2 is calculated by using the collection voltage, so that the measurement accuracy (preciseness of measurement) of the sheet resistance can be improved.

Conventionally, after the voltage (reference voltage) in an empty state is once measured before the start of the measurement of the electrically conductive film 2, the correction is carried out based on the reference voltage (reference voltage in a state of not being influenced by the hysteresis) measured before the measurement's start during the measurement of the actual voltage of the electrically conductive film 2. Thus, in a case where the hysteresis is generated during the measurement, the voltage is calculated without consideration of the influence of the hysteresis. Accordingly, the measurement accuracy of the sheet resistance is poor in the conventional way.

The resistance measurement device 4 can measure the sheet resistance, while the probe unit 34 scans in the width direction. That is, the resistance measurement device 4 is a traverse-type. Thus, the resistance measurement device 4 can also measure a freely-selected portion in the width direction in addition to a freely-selected portion in the conveyance direction of the electrically conductive film 2.

The resistance measurement device 4 can remove or reduce the influence by the coil temperature, so that a temperature sensor mounted on the probe unit 34 in order to detect a temperature of the coil 36 can be unnecessary. Accordingly, the probe unit 34 can be made compact.

In the resistance measurement device 4, the arithmetic unit 33 memorizes the reference voltage in the memory 37 at least once (to be specific, once) every one reciprocation of the probe unit 34 in the non-conveyance region 28 and the conveyance region 27.

Thus, the actual voltage immediately after the reference voltage can be corrected based on the reference voltage measured every one reciprocation of the probe unit 34. Thus, a difference of the hysteresis generated by a time lag between the reference voltage measurement and the actual voltage measurement can be substantially eliminated, and the hysteresis at the time of the measurement of the reference voltage and the hysteresis at the time of the measurement of the actual voltage can be furthermore surely cancelled. As a result, the measurement accuracy of the sheet resistance of the electrically conductive film 2 can be furthermore improved.

The film manufacturing apparatus 1 includes the sputtering unit 6 laminating the electrically conductive layer 22 on the substrate film 10 that is long in the conveyance direction, the conveyance unit 8 conveying the electrically conductive film 2, and the above-described resistance measurement device 4.

Thus, a defect of the sheet resistance can be precisely detected. Accordingly, the electrically conductive film 2 having the defective sheet resistance can be surely considered or removed. Thus, the electrically conductive film 2 having the furthermore uniform sheet resistance can be manufactured.

The method for manufacturing the electrically conductive film 2 includes the lamination step of laminating the electrically conductive layer 22 on the long-length substrate film 10 to produce the electrically conductive film 2; and the resistance measurement step of measuring the sheet resistance of the electrically conductive film 2 while conveying the electrically conductive film 2 in the conveyance direction and allowing the probe unit 34 to scan in both the conveyance region 27 and the non-conveyance region 28 in the width direction. The resistance measurement step includes the reference voltage measurement step of measuring the reference voltage in the non-conveyance region 28; the actual voltage measurement step of measuring the actual voltage of the electrically conductive film 2 while allowing the probe unit 34 to scan in the conveyance region 27 in the width direction; and the calculation step of correcting the actual voltage based on the reference voltage, and calculating the sheet resistance of the electrically conductive film.

In the method for manufacturing the electrically conductive film 2, the probe unit 34 scans in both the conveyance region 27 and the non-conveyance region 28 of the electrically conductive film 2, and the actual voltage measured in the conveyance region 27 is corrected based on the reference voltage measured in the non-conveyance region 28.

Thus, the reference voltage of the non-conveyance region 28 in the process of measurement is measured, and the actual voltage can be corrected based on the reference voltage. Accordingly, based on the reference voltage influenced by the coil temperature and the hysteresis generated in the probe unit 34, the actual voltage influenced in the same manner is corrected, so that the influence of the coil temperature and the hysteresis generated in the probe unit 34 is removed or reduced. Then, the sheet resistance is calculated by using the correction voltage, so that the measurement accuracy (preciseness of measurement) of the sheet resistance of the electrically conductive film 2 can be improved. Accordingly, a defect of the sheet resistance of the electrically conductive film 2 can be precisely detected, and the electrically conductive film 2 having the defective sheet resistance can be surely considered or removed. As a result, the electrically conductive film 2 having the uniform sheet resistance can be manufactured.

4. Modified Examples

In the following modified examples, the same reference numerals are provided for members and steps corresponding to each of those in the above-described one embodiment, and their detailed description is omitted. The modified examples can be appropriately used in combination. Furthermore, each of the modified examples can achieve the same function and effect as that of one embodiment unless otherwise specified.

In one embodiment shown in FIG. 3, the reference voltage is measured and memorized once every one reciprocation. Alternatively, for example, as referred to FIGS. 5A and 5B, the reference voltage can be also measured and memorized twice every one reciprocation (that is, once every one outward way and once every one return way).

As shown in FIGS. 5A and 5B, in the embodiment, the scanning unit 32 can reciprocate the probe unit 34 in the one-side non-conveyance region 28a, the conveyance region 27, and the other-side non-conveyance region 28b in the width direction. The reference voltage is measured in each of the one-side non-conveyance region 28a and the other-side non-conveyance region 28b to be memorized in the memory 37, while the probe unit 34 scans the one-side non-conveyance region 28a, the conveyance region 27, and the other-side non-conveyance region 28b in the width direction.

In one embodiment shown in FIG. 3, the reference voltage is measured and memorized once every one reciprocation. Alternatively, for example, though not shown, the reference voltage can be also measured and memorized once every multiple reciprocations. To be specific, the reference voltage can be measured and memorized, for example, once every one to 1000 reciprocations, preferably once every one to five reciprocations.

In the embodiment, the probe unit 34 may scan in the non-conveyance region 28 only when the reference voltage is measured, or also when the reference voltage is not measured.

In one embodiment shown in FIG. 1, the probe unit 34 is a double-sided probing unit including the two probes 34a and 34b disposed to face each other. Alternatively, for example, though not shown, the probe unit 34 can be also a one-sided probing unit including only the one probe 34a.

In one embodiment shown in FIG. 1, the sputtering unit is provided as a lamination unit. Alternatively, for example, a vacuum vapor deposition unit and a chemical vapor deposition unit can be also provided as a lamination unit. In this case, the lamination unit includes a vapor deposition source consisting of a material for the electrically conductive layer 22 instead of the target 16. The lamination unit may be also an application unit, a printing unit, or the like.

5. Verification

[Influence of Hysteresis]

By using a non-contact sheet resistance measurement module (double-sided puking unit, manufactured by NAPSON CORPORATION, part number "NC-700V", including a coil temperature sensor), the voltage (reference voltage) in a state of not conveying the electrically conductive film 2 (empty state) was measured for, a long time (about 960 minutes). In the measurement, the correction of the voltage with respect to a change in the coil temperature was automatically processed in an arithmetic program (for example, a temperature correction formula shown in FIG. 7) provided in the non-contact sheet resistance measurement module. As this result, a graph showing a relationship between the measurement time and the displacement in the reference voltage is shown in FIG. 6. The voltage displacement shown in FIG. 6 defines the voltage at the initial time of the measurement (0 minute after the start of the measurement) as a reference value (0 [v]).

As clear in FIG. 6, in the measurement for a long time, it is found that the displacement at the reference voltage is greatly changed to 0.015 [v] or less, so that an error of the reference voltage becomes large. Accordingly, when the sheet resistance of the electrically conductive film 2 is measured with such a measurement device, it is found that the measured value of the sheet resistance is calculated considering the voltage including the above-described error, so that a measurement error becomes large.

Meanwhile, a graph showing a relationship between the coil temperature and the voltage at the reference voltage (measurement value) at this time is shown as a dashed line in FIG. 7. The coil temperature fell from 27.4° C. to 24.6° C., subsequently, rose to 29.5° C., and then, fell to 27.6° C. A temperature correction formula of the non-contact sheet resistance measurement module (calibration line) is shown as a solid line in FIG. 7.

As clear in FIG. 7, the measured voltage shows a different value at the same temperature depending on a case where the coil temperature rises and a case where the coil temperature falls. Accordingly, it is found that the hysteresis exists in the probe unit 34 of the non-contact sheet resistance measurement module, and the hysteresis is a cause of the error shown in FIG. 6.

[Verification]

The measurement is carried out by using the measurement device shown in FIG. 1. To be specific, a non-contact sheet resistance measurement module (double-sided probing unit, manufactured by NAPSON CORPORATION, part number "NC-700V") was used as the measurement unit 31, and the distance D between the probe units 34 was set at 10 mm and the scanning rate of the scanning unit 32 was set at 100 mm/sec.

The voltage (reference voltage) of each of the regions 27 and 28a in a state of not conveying the electrically conductive film 2 (empty state) was measured for a long time (about 1900 minutes), while the probe unit 34 scanned in both the conveyance region 27 and the one-side non-conveyance region 28a in the width direction (ref: FIG. 3). In each of the obtained reference voltages of the conveyance region 27 and the one-side non-conveyance region 28a, the value of the reference voltage of the conveyance region 27 was deducted by the value of the reference voltage of the one-side non-conveyance region 28a that was measured immediately before the reference voltage of the conveyance region 27. A graph showing a relationship between the measurement time and the displacement at the reference voltage of the conveyance region 27 was drawn based on the data, and shown in FIG. 8. The voltage displacement shown in FIG. 8 defines the voltage at the initial time of the measurement (0 minute after the start of the measurement) as a reference value (0 [v]).

As clear in FIG. 8, the voltage displacement in a reference state was small within +0.005 [v] in the measurement for a long time, and the error was small. Accordingly, it is found that when the sheet resistance of the electrically conductive film 2 is measured for a long time by using the device and the manufacturing method of the present invention, the measurement error can be made small. This is assumingly caused by the fact that the voltage of the conveyance region 27 is corrected by the voltage of the one-side non-conveyance region 28a immediately before the voltage of the conveyance region 27 in the process of measurement, so that the influence specific to the device generated in both regions 27 and 28a (to be specific, the influence of the coil temperature and the hysteresis) cancels each other.

6. Reference Embodiment

In the following embodiment, the same reference numerals are provided for members and steps corresponding to each of those in the above-described embodiment, and their detailed description is omitted. The modified examples can be appropriately used in combination.

[Film Manufacturing Apparatus and Resistance Measurement Device]

As shown in FIG. 9, a film manufacturing apparatus 41 of reference embodiment includes the lamination conveyance device 3 and a second resistance measurement device 42. The second resistance measurement device 42 includes the measurement unit 31, a temperature sensor 43, the scanning unit 32, and a second arithmetic unit 44.

The temperature sensor 43 detects the temperature of the coil 36.

The second arithmetic unit 44 calculates the sheet resistance of the electrically conductive film 2 based on the voltage (actual voltage) measured by the probe unit 34.

The second arithmetic unit 44 includes a second memory 45 and a second arithmetic program 46.

The second memory 45 memorizes the data of the hysteresis.

As shown by the dashed line of FIG. 7, an example of the data of the hysteresis includes a profile showing both a relationship between the coil temperature and the voltage during temperature rising of the coil 36 and a relationship between the coil temperature and the voltage during temperature falling of the coil 36 (or one of a collection formula and a calibration curve showing both of these).

The second arithmetic program 46 calculates the sheet resistance of the electrically conductive film 2 by using the data of the actual voltage of the electrically conductive film 2 measured in the probe unit 34, the temperature (detection temperature) detected in the temperature sensor 43, and the data of the hysteresis memorized in the second memory 45.

[Manufacturing Method of Film]

The film manufacturing apparatus 41 of reference embodiment is used. The method for manufacturing the electrically conductive film 2 of reference embodiment includes a lamination step, a resistance measurement step, and a selection step.

The lamination step and the selection step are the same as those of the above-described embodiment.

The resistance measurement step includes an actual voltage measurement step and a second calculation step.

The actual voltage measurement step is the same as that of the above-described embodiment.

In the second calculation step, the actual voltage is corrected based on the detection temperature and the hysteresis data, and the sheet resistance of the electrically conductive film 2 is calculated.

To be specific, the voltage to be corrected with respect to the actual voltage based on the hysteresis is obtained from the detection temperature, and subsequently, the actual voltage is corrected based on the obtained voltage. By using the corrected actual voltage (correction voltage), the sheet resistance is calculated by a known calculation formula.

The selection step is the same as that of the above-described embodiment.

In this manner, the uniform electrically conductive film 2 having the sheet resistance within a desired range is manufactured.

In the second resistance measurement device 42 of reference embodiment, the actual voltage is corrected based on the detection temperature and the hysteresis data memorized in the second memory 45, and the sheet resistance is calculated. Thus, the measurement accuracy of the sheet resistance can be improved.

The film manufacturing apparatus 41 of reference embodiment includes the sputtering unit 6, the conveyance unit 8, and the above-described resistance measurement device 42. Thus, a defect of the sheet resistance of the electrically conductive film 2 can be precisely detected, and the electrically conductive film 2 having the uniform sheet resistance can be manufactured.

The manufacturing method of reference embodiment includes a lamination step and a resistance measurement step, and the resistance measurement step includes a second calculation step of correcting the actual voltage based on the detection temperature and the hysteresis data and calculating the sheet resistance of the electrically conductive film 2. Thus, a defect of the sheet resistance of the electrically conductive film 2 can be precisely detected, and the electrically conductive film 2 having the uniform sheet resistance can be manufactured.

Preferably, the embodiment shown in FIG. 1 is used. In the embodiment shown in FIG. 1, the actual voltage is corrected based on the reference voltage in the process of measurement. Thus, the influence of the error generated in the actual voltage measurement and the influence generated in the reference voltage measurement in the same manner are cancelled, so that the influence of the device characteristics other than the hysteresis is also considered (reduced). Accordingly, in the embodiment shown in FIG. 1, the measurement accuracy can be furthermore precisely improved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The resistance measurement device and the film manufacturing apparatus of the present invention can be applied for various industrial products, and can be, for example, preferably used for manufacturing an electrically conductive film.

DESCRIPTION OF REFERENCE NUMBER

1 Film manufacturing apparatus
2 Electrically conductive film
4 Resistance measurement device
6 Sputtering unit
8 Conveyance unit
10 Substrate film
11 Feeding roll
20 Winding roll
22 Electrically conductive layer
27 Conveyance region
28 Non-conveyance region
32 Scanning unit
33 Arithmetic unit
34 Probe
36 Coil
37 Memory

The invention claimed is:

1. A resistance measurement device for measuring, sheet resistance of an electrically conductive film that is long in one direction, comprising:
   a probe unit disposed to face the electrically conductive film,
   a scanning unit that allows the probe unit to scan in a cross direction crossing the one direction over both a conveyance region and a non-conveyance region of the electrically conductive film; and
   an arithmetic unit that calculates a sheet resistance of the electrically conductive film based on a voltage measured by the probe unit, wherein
   the arithmetic unit
   includes a memory that memorizes a reference voltage measured in the non-conveyance region, and
   corrects, based on the reference voltage, an actual voltage measured by allowing the probe unit to scan in the cross direction in the conveyance region.

2. The resistance measurement device according to claim 1, wherein
   the arithmetic unit memorizes the reference voltage in the memory at least once every one reciprocation or multiple reciprocations of the probe unit in the non-conveyance region and the conveyance region.

3. A film manufacturing apparatus for manufacturing an electrically conductive film that is long in one direction, comprising:
   a lamination unit that laminates an electrically conductive layer at a substrate film that is long in the one direction to produce an electrically conductive film;
   a conveyance unit that conveys the electrically conductive film; and
   the resistance measurement device according to claim 1 that measures sheet resistance of the electrically conductive film conveyed by the conveyance unit.

4. A method for manufacturing an electrically conductive film that is long in one direction, comprising:
   a lamination step of laminating an electrically conductive layer at a substrate film that is long in the one direction to produce an electrically conductive film; and
   a resistance measurement step of measuring sheet resistance of the electrically conductive film, while conveying, the electrically conductive film in the one direction and allowing a probe unit to scan in a cross direction crossing the one direction, over both a conveyance region and a non-conveyance region of the electrically conductive film, wherein the resistance measurement step includes:
a reference voltage measurement step of measuring a reference voltage in the non-conveyance region;
an actual voltage measurement step of measuring an actual voltage of the electrically conductive film while allowing the probe unit to scan in the cross direction in the conveyance region; and
a calculation step of correcting the actual voltage based on the reference voltage, and calculating the sheet resistance of the electrically conductive film.

5. The method for manufacturing an electrically conductive film according to claim 4, wherein
the reference voltage measurement step is carried out at least once every one reciprocation or multiple reciprocations of the probe unit in the non-conveyance region and the conveyance region.

* * * * *